United States Patent
Furuya

(10) Patent No.: US 7,596,192 B2
(45) Date of Patent: Sep. 29, 2009

(54) AUTOMATIC GAIN CONTROL METHOD FOR RADIO COMMUNICATION MOBILE STATION

(75) Inventor: Tomoki Furuya, Tokyo (JP)

(73) Assignee: NEC Corporation, Tokyo (JP)

( * ) Notice: Subject to any disclaimer, the term of this patent is extended or adjusted under 35 U.S.C. 154(b) by 549 days.

(21) Appl. No.: 10/933,346

(22) Filed: Sep. 3, 2004

(65) Prior Publication Data

US 2005/0053175 A1  Mar. 10, 2005

(30) Foreign Application Priority Data

Sep. 5, 2003  (JP) .............................. 2003-314539

(51) Int. Cl.
H04L 27/08  (2006.01)
(52) U.S. Cl. ..................... 375/345; 375/346; 375/230
(58) Field of Classification Search ................ 375/345, 375/346, 326, 324, 344, 347; 455/192.2, 455/256, 245, 234, 522, 69
See application file for complete search history.

(56) References Cited

U.S. PATENT DOCUMENTS

| 5,901,347 | A |   | 5/1999  | Chambers et al. |
| 5,982,821 | A |   | 11/1999 | Kingston et al. |
| 6,130,922 | A | * | 10/2000 | Stott et al. ................ 375/344 |
| 6,148,189 | A |   | 11/2000 | Aschwanden |
| 6,324,228 | B1 |  | 11/2001 | Millward et al. |
| 6,560,448 | B1 |  | 5/2003  | Baldwin et al. |
| 6,577,852 | B1 |  | 6/2003  | Iwata et al. |
| 6,885,851 | B1 | * | 4/2005  | Miura ..................... 455/234.1 |
| 2002/0163981 | A1 |  | 11/2002 | Troemel, Jr. |
| 2003/0176203 | A1 | * | 9/2003 | Sih et al. ..................... 455/522 |
| 2006/0188042 | A1 | * | 8/2006 | Takatz et al. ................ 375/345 |

FOREIGN PATENT DOCUMENTS

| EP | 1 175 005 A2 | 1/2002 |
| JP | 2000-59158 A | 2/2000 |
| JP | 2000-269759 A | 9/2000 |
| JP | 2001-016638 A | 1/2001 |
| JP | 2001-024454 A | 1/2001 |
| JP | 2001-345757 A | 12/2001 |
| JP | 2003-283278 | 10/2003 |

* cited by examiner

Primary Examiner—Chieh M Fan
Assistant Examiner—Qutbuddin Ghulamali
(74) Attorney, Agent, or Firm—Sughrue Mion, PLLC

(57) ABSTRACT

A signal transmitted from a base station is received by a receiver. The received signal is supplied to an AGC amplifier and is then supplied to a demodulator, so that the signal is demodulated into baseband signals. The baseband signals are supplied to a baseband signal processor. The baseband signals are also processed through an instantaneous received power calculator, an average received power calculator, and a feedback AGC code generator to produce an AGC signal. The gain of the AGC amplifier is controlled based on the AGC signal. A fading pitch measuring device measures a fading pitch from the instantaneous power calculated by the instantaneous received power calculator. The average received power calculator changes averaging time required to calculate average received power depending on the measured fading pitch.

2 Claims, 6 Drawing Sheets

| FADING PITCH SPEED | AVERAGING TIME |
|---|---|
| ~a | A |
| a~b | B |
| . | . |
| . | . |
| e~f | F |
| f~ | G |

FIG. 3

AUTOMATIC GAIN CONTROL METHOD FOR RADIO COMMUNICATION MOBILE STATION

BACKGROUND OF THE INVENTION

1. Field of the Invention

The present invention relates to automatic gain control used in radio communication mobile stations and, more particularly, to an automatic gain control method for realizing stable reception characteristics against a change in fading period.

2. Description of the Related Art

Generally, automatic gain control (AGC) used in radio communication mobile stations is performed so as to keep constant the amplitude of an in-phase (I) component signal and that of a quadrature (Q) component signal supplied from a radio unit to a baseband signal processing unit in a radio communication mobile station. FIG. 5 is a block diagram of an example of the arrangement of components for AGC in a conventional radio communication mobile station.

Referring to FIG. 5, the radio communication mobile station includes an antenna 501 for receiving a signal transmitted from a base station, a receiver 502 for radio signal processing, e.g., frequency-converting the received signal having a radio frequency bandwidth into a signal having an intermediate frequency bandwidth, an AGC amplifier 503, of which gain is controlled depending on the power level of the received signal, an orthogonal demodulator 504 for performing orthogonal demodulation and frequency conversion to the intermediate frequency signal to produce I-component and Q-component baseband signals, analog-to-digital (AD) converters 505 for converting the baseband signals, that are analog, into digital signals, respectively, a baseband signal processor 506, an instantaneous received power calculator 507 for calculating the instantaneous power of the received signal from the I-component and Q-component signals, an average received power calculator 508 for calculating the average of the received power, and a feedback AGC code generator 509 for comparing the average received power with reference power, calculating the amount of gain control of the AGC amplifier 503 so as to offset the difference between the average received power and the reference power, and then feeding back the amount of gain control to the AGC amplifier 503.

The conventional radio communication mobile station of FIG. 5 operates as follows.

The antenna 501 receives a signal transmitted from a base station (not shown). The receiver 502 performs radio signal processing, e.g., frequency-converts the received signal having a radio frequency bandwidth into an intermediate frequency signal. The converted signal is supplied to the AGC amplifier 503 and is then supplied to the orthogonal demodulator 504.

The orthogonal demodulator 504 performs orthogonal demodulation-and frequency conversion to the supplied intermediate frequency signal to generate I-component and Q-component baseband signals. The AD converters 505 convert the I-component and Q-component baseband signals that are analog into digital signals, respectively. The baseband signal processor 506 performs digital signal processing, e.g., error correction to the supplied digital signals.

The I-component and Q-component baseband signals generated from the AD converters 505 are also supplied to the instantaneous received power calculator 507. The instantaneous received power calculator 507 calculates the instantaneous power of the received signal from the supplied I-component and Q-component baseband signals. The average received power calculator 508 calculates average received power per time previously set in the radio communication mobile station. The feedback AGC code generator 509 compares the calculated average received power with the reference power held in the radio communication mobile station.

The feedback AGC code generator 509 calculates the amount of gain control of the AGC amplifier 503 so as to offset the difference between the reference power and the average received power calculated by the average received power calculator 508 and then feeds back the amount of gain control as the amount of AGC to the AGC amplifier 503. The gain of the AGC amplifier 503 is controlled according to the amount of AGC fed back.

For example, when the average received power calculated by the average received power calculator 508 is lower than the reference power, the amount of AGC is determined so that the gain of the AGC amplifier 503 is increased to raise the received power to the extent of offsetting the difference between the reference power and the average received power. The determined amount of AGC is fed back to the AGC amplifier 503. The gain of the AGC amplifier 503 is increased depending on the amount of AGC fed back so that the average power of the I-component and Q-component signals to be generated equals the reference power.

On the other hand, when the average received power calculated by the average received power calculator 508 is higher than the reference power, the gain of the AGC amplifier 503 is reduced so that the average received power of the I-component and Q-component signals equals the reference power. According to the above operation, the I-component and Q-component signals supplied to the baseband signal processor 506 are made substantially constant.

In the conventional radio communication mobile station, however, under circumstances where the power of a received signal varies due to fast fading, the gain control of the AGC amplifier 503 cannot follow a steep change in received signal power, resulting in variations of the respective amplitudes of I-component and Q-component signals to be generated. Disadvantageously, an error occurs in the received signal in the baseband signal processor 506. This problem will now be described with reference to FIGS. 6A and 6B in terms of a variation in received signal power caused by fast fading.

FIG. 6A shows a change in power of a received signal and a change in power of the I-component and Q-component signals supplied to the baseband signal processor 506 when a fading pitch is low, i.e., in a slow fading environment. Referring to FIG. 6A, when the fading pitch is low, the gain control of the AGC amplifier 503 can follow a change in received signal power. Obviously, the power of the I-component and Q-component signals supplied to the baseband signal processor 506 is made substantially constant.

FIG. 6B shows a change in power of a received signal and a change in power of the I-component and Q-component signals supplied to the baseband signal processor 506 when a fading pitch is high, i.e., in a fast fading environment. Referring to FIG. 6B, when the fading pitch is high, the gain control of the AGC amplifier 503 cannot follow a steep change in received signal power and the power of the I-component and Q-component signals supplied to the baseband signal processor 506 is fluctuated.

In the conventional radio communication mobile station, the amount of AGC is determined based on the difference between the reference power and the average received signal power per predetermined time. Even when the fading pitch becomes higher, the gain of the AGC amplifier 503 is controlled every predetermined period. Consequently, the gain control of the AGC amplifier 503 cannot follow a steep change in received signal power, resulting in a fluctuation in power of the I-component and Q-component baseband signals.

Japanese Unexamined Patent Application Publication Nos. 2000-59158 (Patent Document 1) and 2000-269759 (Patent Document 2) disclose technologies of generating an automatic gain control signal corresponding to a fading period to prevent a steep change in received signal power depending on fading.

Patent Document 1 discloses a system including detection means for detecting an output signal obtained by amplifying an input signal through a variable gain amplifier, fading period detection means for detecting a fading period indicative of a changing period of the input signal, difference generation means for generating the difference between a target convergence value and a digital value of the voltage of the detected signal, variable multiplication means for variably multiplying the difference depending on the fading period, difference change calculation means for calculating a change in the difference subjected to variable multiplication, and control signal generation means for converting the change in the difference according to a predetermined conversion method to generate an automatic gain control signal for the variable gain amplifier. Thus, the loop gain characteristic can be optimized against a steep change in received signal power depending on fading.

Patent Document 1 further discloses a system including detection means for detecting an output signal obtained by amplifying an input signal through a variable gain amplifier, fading period detection means for detecting a fading period indicative of a changing period of the input signal, difference generation means for generating the difference between a target convergence value and a digital value of the voltage of the detected signal, difference change calculation means for calculating a change in the difference, conversion-method selection means for selecting a conversion method of converting the change in the difference from among a plurality of conversion methods according to the fading period, and means for converting the change in the difference according to the selected conversion method to generate an automatic gain control signal for the variable gain amplifier. The same advantages as those of the above system are obtained.

Patent Document 2 discloses a circuit including control signal generation means for detecting the level of an output signal obtained by amplifying a received signal through a variable gain amplifier to generate a feedback signal as a control signal for the variable gain amplifier, fading pitch detection means for detecting the fading pitch of the received signal, and means for determining generating time or period of the control signal according to the detected fading pitch. Thus, the same advantages as those of the above-mentioned systems are obtained.

According to the invention disclosed in Patent Document 1, the system requires the variable multiplication means for multiplying the difference between the target convergence value and the digital value of the detected voltage depending on the fading period, the difference change calculation means for obtaining a change in the difference subjected to variable multiplication, and the control signal generation means for converting the change in the difference according to the predetermined conversion method to generate an automatic control signal. Unfortunately, the structure of the system is complicated.

According to the invention disclosed in Patent Document 2, data detected by a level detector is always averaged every predetermined time by an averaging unit independent of a fading period. A signal generated from the averaging unit does not follow the fading period. Disadvantageously, the optimum automatic gain control loop cannot be set with respect to various fading periods.

Generally, in controlling an AGC amplifier used in a radio communication mobile station, a received signal having a radio frequency bandwidth is subjected to orthogonal demodulation into I-component and Q-component baseband signals. Average received power per predetermined time is calculated from the I-component and Q-component baseband signals. The calculated average received power is compared to reference power set in the radio communication mobile station to obtain the difference therebetween. The gain of the AGC amplifier is controlled so as to offset the difference. The respective amplitudes of the I-component and Q-component baseband signals are controlled to be always made constant independent of a change in received signal power at an antenna.

So long as the gain control of the AGC amplifier is properly performed, the respective amplitudes of the I-component and Q-component signals obtained by orthogonal demodulation are always kept constant. However, in a case where the fading pitch of a signal received at the antenna is high because the corresponding radio communication mobile station moves at a high speed, when the gain of the AGC amplifier is controlled using calculated average received power per predetermined time, the average received power cannot follow a change in power due to fast fading. Even when the gain of the AGC amplifier is controlled based on this average received power, the amplitudes of the I-component and Q-component baseband signals are not always made constant. Disadvantageously, an error occurs in the received signal.

SUMMARY OF THE INVENTION

In consideration of the above disadvantages, it is an object of the present invention to provide a new technique capable of setting an automatic gain control loop which can follow fading pitches having different periods with a relatively simple configuration.

The present invention provides an automatic gain control method for a radio communication mobile station, the method including the steps of: measuring a fading pitch on the basis of the power of a signal received by the radio communication mobile station; and changing averaging time required to calculate average received power used in automatic gain control depending on the fading pitch.

According to the method of the present invention, a fading pitch is measured on the basis of the power of a received signal, and averaging time required to calculate average received power used in controlling an AGC amplifier is changed. When the received signal power changes very strongly, namely, the fading pitch is high, the gain control of the AGC amplifier is performed at a high rate, thus allowing the gain control of the AGC amplifier to follow the change in received power due to fast fading. Consequently, the amplitudes of I-component and Q-component baseband signals obtained by orthogonal demodulation can be kept constant, thus preventing a degradation in receiver sensitivity.

The present invention further provides a radio communication mobile station having a fading pitch measuring device for measuring the fading pitch of a received signal. When the fading pitch is high, averaging time required to calculate average received power used to obtain an AGC signal is reduced, thus allowing the gain control of an AGC amplifier to follow a steep change in received signal power due to fast fading so that the amplitudes of I-component and Q-component baseband signals to be supplied to a baseband signal processor are always kept constant.

More particularly, the present invention provides a radio communication mobile station including: an antenna for receiving a signal transmitted from a base station; a receiver for converting the received signal having a radio frequency bandwidth into an intermediate frequency signal; an AGC amplifier for amplifying the intermediate frequency signal; an orthogonal demodulator for performing orthogonal demodulation and frequency conversion to the intermediate frequency signal generated from the AGC amplifier to produce I-component and Q-component baseband signals; AD converters for converting the I-component and Q-component baseband signals, that are analog, generated from the orthogonal demodulator into digital signals, respectively; a baseband signal processor for processing the digital signals generated from the AD converters; an instantaneous received power calculator for calculating instantaneous power from the digital signals generated from the AD converters; a fading pitch measuring device for measuring a fading pitch based on the instantaneous power calculated by the instantaneous received power calculator; an average received power calculator, which receives the instantaneous power calculated by the instantaneous received power calculator and information related to the fading pitch measured by the fading pitch measuring device, for calculating average received power from the instantaneous power calculated by the instantaneous received power calculator according to averaging time set depending on the fading pitch information; and a feedback AGC code generator for calculating a signal to control the gain of the AGC amplifier so as to offset the difference between reference power and the average received power calculated by the average received power calculator and then feeding back the signal as an AGC signal to the AGC amplifier.

According to the method of the present invention, the fading pitch of a received signal is measured, and the measured fading pitch is compared to a reference value. If the measured fading pitch is higher than the reference value, averaging time required to calculate average received power is reduced. Even when the power of a received signal steeply changes due to fast fading, the gain control of an AGC amplifier can follow the steep change in received power, so that the respective amplitudes of I-component and Q-component baseband signals to be supplied to a baseband signal processor can always be kept constant. A degradation in receiver sensitivity can be prevented.

BRIEF DESCRIPTION OF THE DRAWINGS

FIG. 3 is a table showing an example in which different averaging times are set for various fading pitches;

DESCRIPTION OF THE PREFERRED EMBODIMENTS

Figure 1:
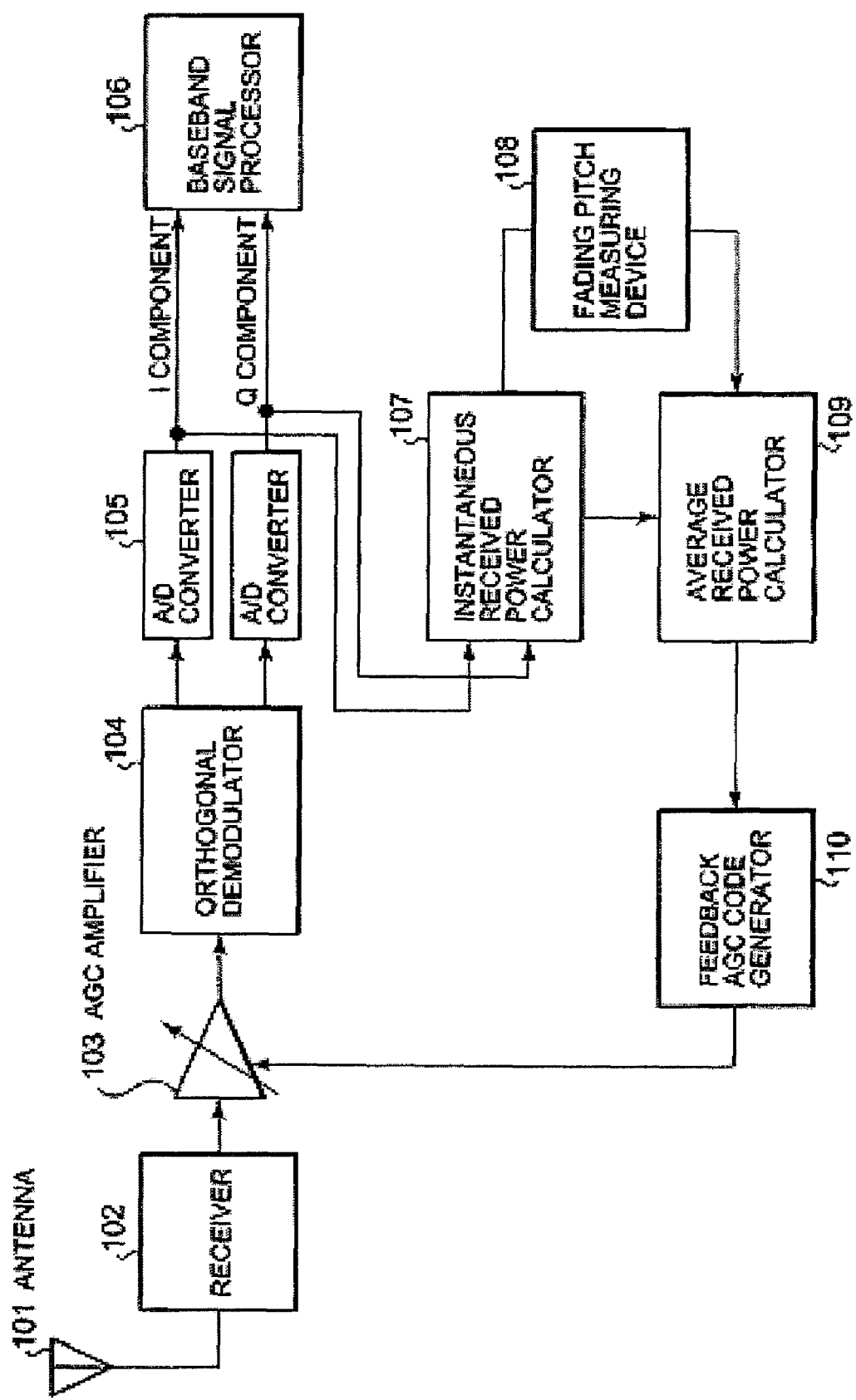
FIG. 1 is a block diagram of a radio communication mobile station according to a first embodiment of the present invention.

FIG. 1 is a block diagram of a radio communication mobile station according to a first embodiment of the present invention.

The radio communication mobile station according to the present embodiment includes an antenna 101 for receiving a radio signal transmitted from a base station (not shown), a receiver 102 for performing radio signal processing, e.g., frequency-converting the received signal having a radio frequency bandwidth into a radio signal having an intermediate frequency bandwidth, an AGC amplifier 103 of which gain is controllable depending on the power of the received signal, an orthogonal demodulator 104 for performing orthogonal demodulation and frequency conversion to the intermediate frequency signal to produce I-component and Q-component baseband signals, analog-to-digital (AD) converters 105 for converting the I-component and Q-component baseband signals, that are analog, into digital signals, respectively, a baseband signal processor 106 for performing digital signal processing, e.g., correcting an error in a transmission path, an instantaneous received power calculator 107 for calculating the instantaneous received power of the received signal from the I-component and Q-component signals, a fading pitch measuring device 108 for measuring a fading pitch on the basis of the calculated instantaneous received power, an average received power calculator 109 for calculating the average of received power, and a feedback AGC code generator 110 for comparing the average received power calculated by the average received power calculator 109 with reference power held in the radio communication mobile station to obtain the difference therebetween, determining the amount of gain control of the AGC amplifier 103 so as to offset the difference so long as there is the difference, and then feeding back the amount of gain control to the AGC amplifier 103.

The fading pitch measuring device 108 is arranged between the instantaneous received power calculator 107 and the average received power calculator 109. The fading pitch measuring device 108 measures the fading pitch of a received signal on the basis of a result of the calculation by the instantaneous received power calculator 107. A result of the measurement is supplied to the average received power calculator 109 arranged in the post stage of the fading pitch measuring device 108. Depending on the fading pitch supplied from the fading pitch measuring device 108, the average received power calculator 109 controls averaging time required to calculate average received power used in controlling the AGC amplifier 103.

In other words, the fading pitch measuring device 108 measures a fading pitch on the basis of the calculation result of the instantaneous received power calculator 107. When the fading pitch of a received signal measured by the fading pitch measuring device 108 is higher than the reference value held in the radio communication mobile station, the fading pitch measuring device 108 controls the average received power calculator 109 to reduce averaging time used in calculating the average received power through the average received power calculator 109. When the measured fading pitch is lower than the reference value, the fading pitch measuring device 108 controls the average received power calculator 109 to extend the averaging time used in calculating the average received power through the average received power calculator 109.

The operation of the radio communication mobile station according to the present embodiment will now be described with reference to FIG. 1.

The antenna 101 receives a signal transmitted from the base station (not shown). The receiver 102 frequency-converts the received signal into an intermediate frequency signal. The converted signal is supplied to the AGC amplifier 103 and is then supplied to the orthogonal demodulator 104. The orthogonal demodulator 104 performs orthogonal demodulation and frequency conversion to the input intermediate frequency signal to produce I-component and Q-component baseband signals. The AD converters 105 convert the I-component and Q-component baseband signals that are analog into digital signals, respectively. The baseband signal processor 106 processes the supplied digital signals.

The I-component and Q-component digital signals are also supplied to the instantaneous received power calculator 107. The instantaneous received power calculator 107 calculates the instantaneous power of the received signal from the supplied I-component and Q-component signals. The instantaneous received power calculated through the instantaneous received power calculator 107 is supplied to each of the average received power calculator 109 and the fading pitch measuring device 108.

The fading pitch measuring device 108 obtains the fading pitch of the received signal from the supplied instantaneous received power, compares the obtained fading pitch with the reference value held in the radio communication mobile station, determines averaging time required for the calculation of the average received power used in controlling the AGC amplifier 103, and controls the received power averaging time of the average received power calculator 109.

In other words, when it is determined that the received power calculated by the instantaneous received power calculator 107 varies very strongly due to fast fading and the fading pitch measured by the fading pitch measuring device 108 is higher than the reference value, the averaging time required to calculate the average received power through the average received power calculator 109 is set to a short time suited for fast fading, and the average received power is calculated. On the other hand, when it is determined that the fading pitch measured by the fading pitch measuring device 108 is lower than the reference value, the averaging time required to calculate the average received power through the average received power calculator 109 is set to a long time suited for slow fading, and the average received power is calculated.

The feedback AGC code generator 110 compares the average received power obtained by the average received power calculator 109 with the reference power set in the radio communication mobile station to calculate the difference therebetween, obtains the amount of gain control of the AGC amplifier 103 to offset the difference, and then feeds back the amount of gain control as the amount of AGC to the AGC amplifier 103. The gain of the AGC amplifier 103 is controlled according to the amount of AGC fed back.

According to the above operation, the amplitudes of the I-component and Q-component signals supplied to the baseband signal processor 106 can always be kept constant independent of the fading pitch.

Figure 2:
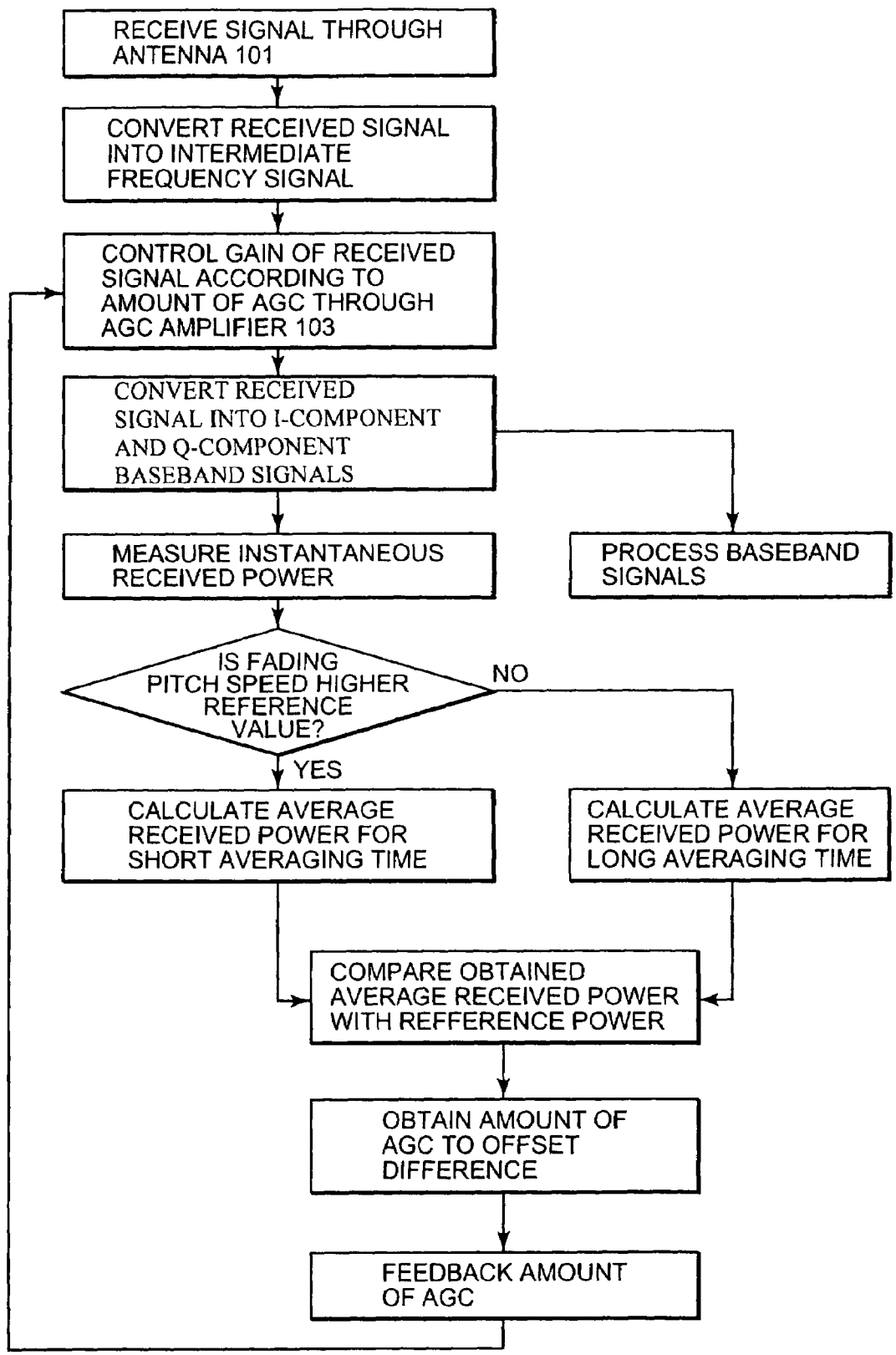
FIG. 2 is a flowchart of the operation of the radio communication mobile station according to the first embodiment.

FIG. 2 is a flowchart of the operation of the radio communication mobile station according to the present embodiment. The operation will now be described in more detail with reference to the flowchart of FIG. 2.

A signal transmitted from the base station is received by the antenna 101. The received signal is frequency-converted into an intermediate frequency signal through the receiver 102. The gain of the intermediate frequency signal is then controlled by the AGC amplifier 103 according to the amount of AGC fed back. The signal is supplied from the AGC amplifier 103 to the orthogonal demodulator 104 and is then subjected to orthogonal demodulation and frequency conversion, so that I-component and Q-component baseband signals are generated. The resultant signals are AD converted into I-component and Q-component digital signals through the AD converters 105, respectively.

The I-component and Q-component signals are subjected to digital signal processing such as error correction by the baseband signal processor 106. The signals are also supplied to the instantaneous received power calculator 107 to calculate the instantaneous power of the received signal. The obtained instantaneous received power is supplied to the fading pitch measuring device 108, thus obtaining the fading pitch of the received signal. The obtained fading pitch is compared to the reference value. If the obtained fading pitch is higher than the reference value, namely, if YES at a first branch point, averaging time used in the average received power calculator 109 is set short. The average received power is calculated for the short averaging time.

In the feedback AGC code generator 110, the average received power obtained by the average received power calculator 109 is compared to the reference power set in the radio communication mobile station, thus calculating the difference therebetween. After that, the amount of gain control of the AGC amplifier 103 to offset the difference is obtained and is then fed back as the amount of AGC to the AGC amplifier 103. The gain of the AGC amplifier 103 is controlled according to the amount of AGC.

On the other hand, if the fading pitch obtained by the fading pitch measuring device 108 is lower than the reference value, namely, if NO at the first branch point, the averaging time used in the average received power calculator 109 is set long. The average received power is calculated for the long averaging time.

After that, in the feedback AGC code generator 110, the average received power obtained by the average received power calculator 109 is compared to the reference power set in the radio communication mobile station, thus calculating the difference therebetween. The amount of gain control of the AGC amplifier 103 to offset the difference is obtained and is then fed back as the amount of AGC to the AGC amplifier 103. The gain of the AGC amplifier 103 is controlled according to the amount of AGC.

According to the above-mentioned first embodiment, the averaging time is switched between a long time and a short time depending on the result of the comparison between the fading pitch and the reference value. A plurality of reference values can be used for the comparison.

FIG. 3 is a table showing an example of received power averaging times provided when a plurality of (two or more) reference values used for the comparison with a fading pitch. Depending on the measured fading pitch which is lower than or equal to a value (a), in the range from the value (a) to a value (b), . . . , in the range from a value (e) to a value (f), or higher than or equal to a value (f) (a<b< . . . <e<f), the averaging time used in the average received power calculator 109 is changed to time A, B, . . . , F, or G (A<B< . . . <F<G). Thus, the respective amplitudes of the I-component and Q-component signals supplied to the baseband signal processor can be kept more constant, thus improving the advantage in that a degradation in receiver sensitivity is prevented.

Figure 4:
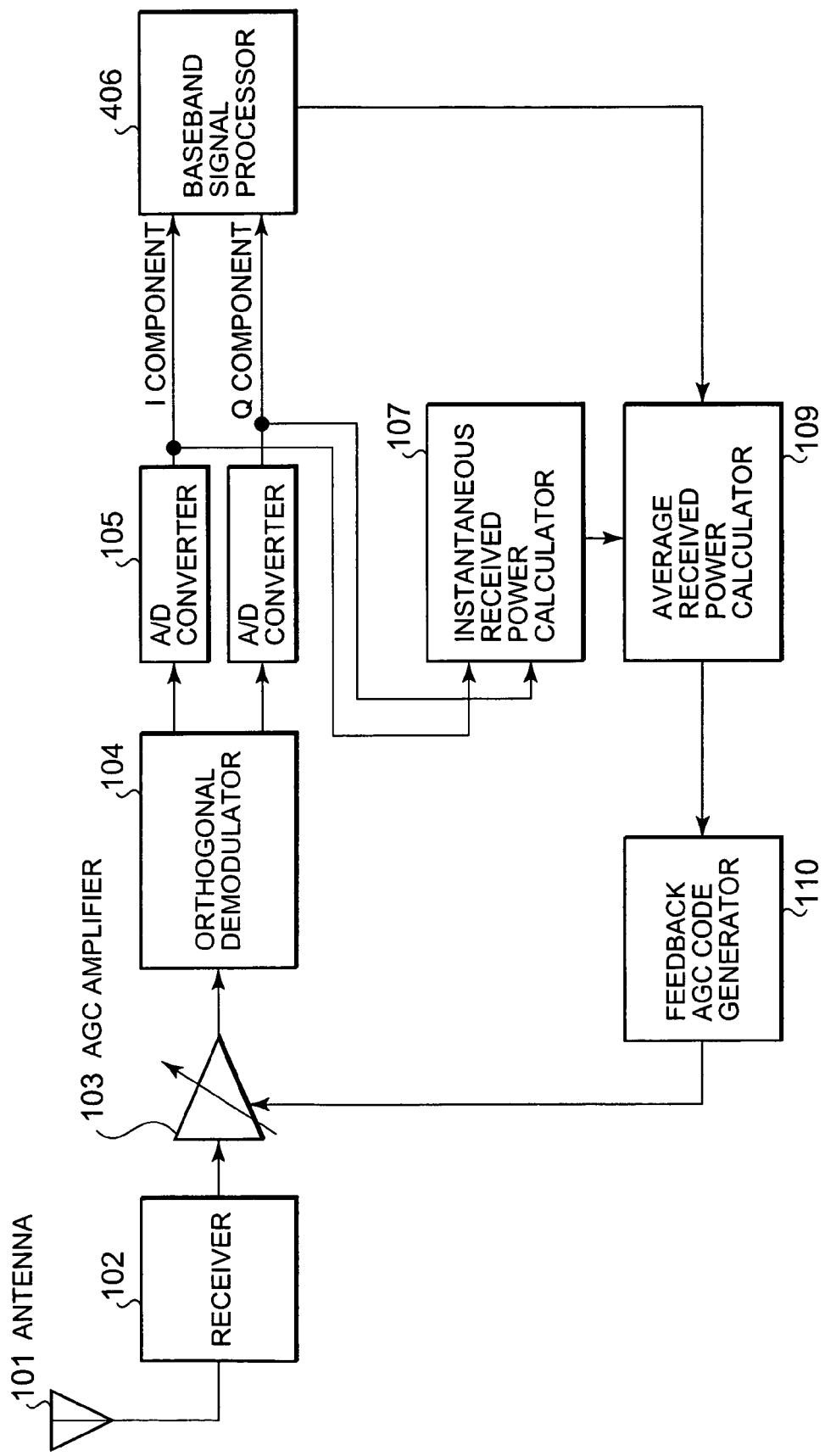
FIG. 4 is a block diagram of a radio communication mobile station according to a second embodiment of the present invention.
Figure 5:
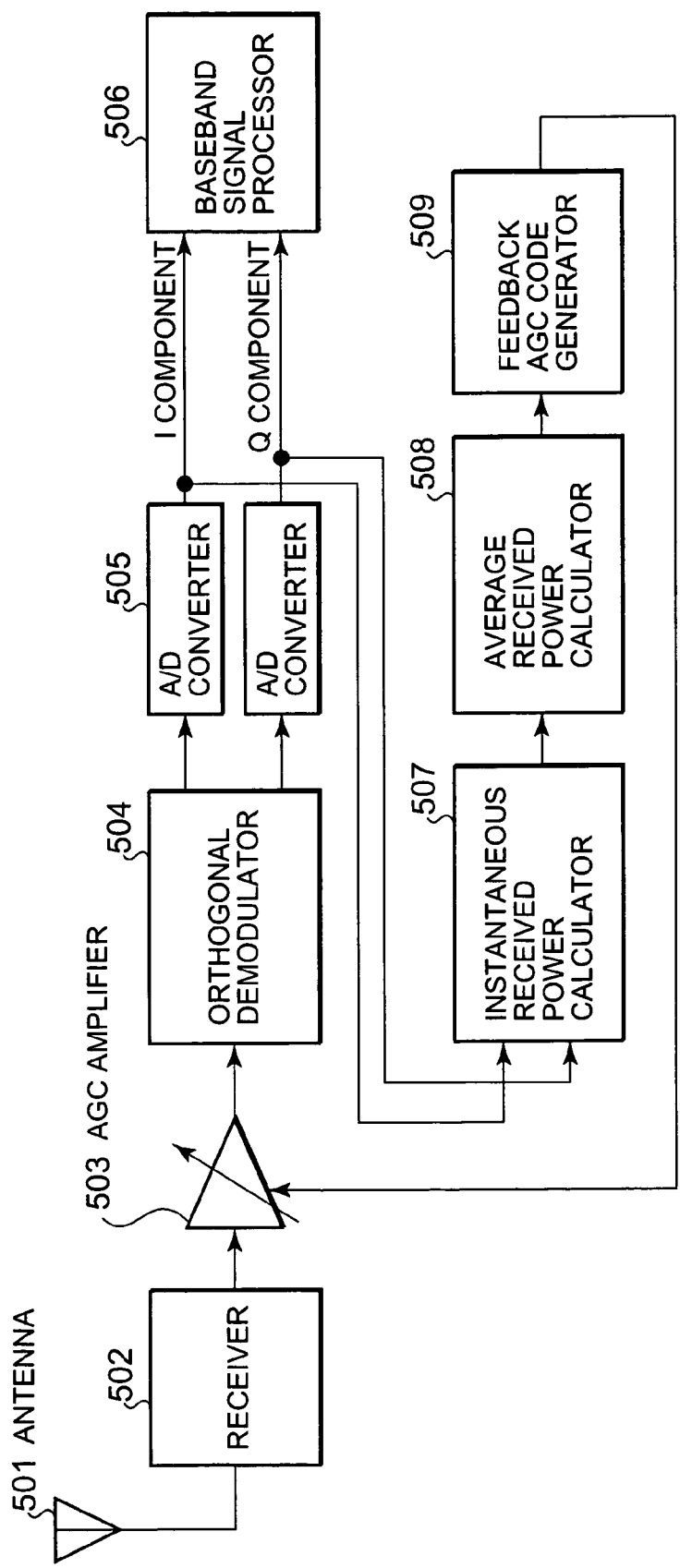
FIG. 5 is a block diagram of the arrangement of components for automatic gain control in a conventional radio communication mobile station.
Figure 6A:
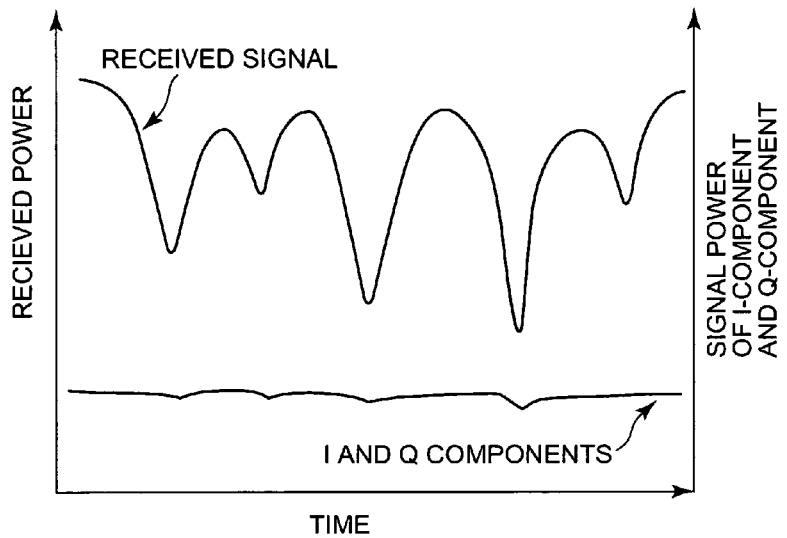
FIGS. 6A and 6B are diagrams explaining AGC characteristics in different fading environments.
Figure 6B:
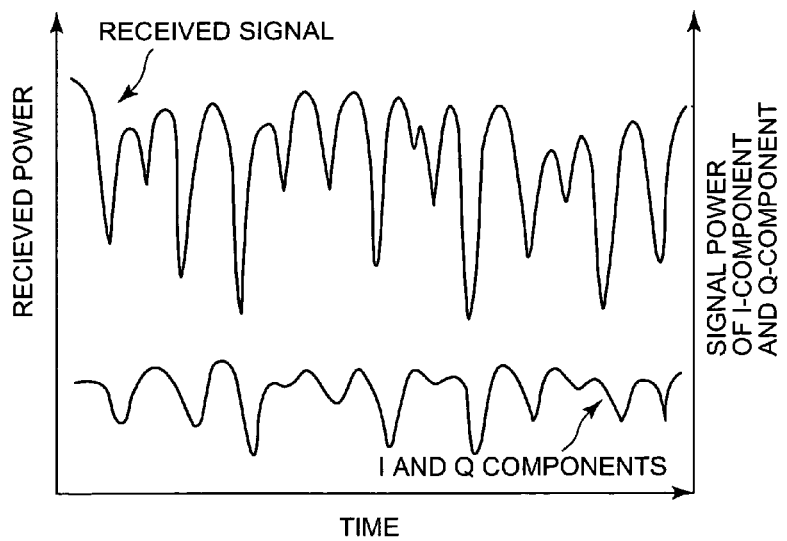

FIG. 4 is a block diagram of a radio communication mobile station according to a second embodiment of the present invention. Referring to FIG. 4, the same components as those in FIG. 1 are designated by the same reference numerals.

According to the foregoing first embodiment, radio waves from the base station are received and the fading pitch thereof is then measured. Averaging time required to calculate the average received power used in controlling the AGC amplifier is changed depending on the measured fading pitch. According to the present embodiment, a base station transmits fading pitch information. A radio communication mobile station receives the fading pitch information and changes averaging time according to the received fading pitch information. The averaging time is required to calculate average received power used in controlling the gain of an AGC amplifier.

Generally, a fading pitch is high in a specific location such as an expressway or a high-rise community. In such an area where it is known that the fading pitch is high, therefore, high fading pitch information is included in information transmitted from a base station. A mobile station moving in this area receives the high fading pitch information, thus reducing averaging time required to calculate the average received power used in controlling the gain of the AGC amplifier.

According to the present embodiment, on the basis of information transmitted from the base station, averaging time required to calculate the average received power used in controlling the gain of the AGC amplifier can be changed immediately. As compared to the case where a fading pitch is determined by measurement, advantageously, any delay does not occur in changing averaging time required to calculate the average received power. The operation of the radio communication mobile station according to the present embodiment will now be described with reference to FIG. 4.

An antenna 101 receives a signal including fading pitch information transmitted from a base station. A receiver 102 frequency-converts the received signal into an intermediate frequency signal. The converted signal is supplied to an AGC amplifier 103 and is then supplied to an orthogonal demodulator 104. The orthogonal demodulator 104 performs orthogonal demodulation and frequency conversion to the input intermediate frequency signal to produce I-component and Q-component baseband signals. AD converters 105 convert the I-component and Q-component baseband signals, which are analog, into digital baseband signals, respectively. A baseband signal processor 406 processes the digital signals.

In processing the supplied I-component and Q-component baseband signals, the baseband signal processor 406 extracts fading pitch information included in the received signal and then supplies the information as an averaging time control signal to an average received power calculator 109.

The I-component and Q-component digital baseband signals are also supplied to an instantaneous received power calculator 107. The instantaneous received power calculator 107 calculates the instantaneous power of the received signal from the I-component and Q-component signals and supplies the obtained instantaneous received power to the average received power calculator 109. The average received power calculator 109 calculates the average of received power based on the supplied instantaneous received power. In this instance, the fading pitch information supplied from the baseband signal processor 406 is compared to a reference value held in the corresponding radio communication mobile station to determine averaging time required to calculate the average received power used in controlling the AGC amplifier 103, so that the averaging time in the average received power calculator 109 is controlled.

In other words, when it is determined that the fading pitch received from the base station is higher than the reference value, the averaging time required to calculate the average received power through the average received power calculator 109 is set short suited for fast fading. The average received power is then calculated. On the other hand, when it is determined that the fading pitch received from the base station is lower than the reference value, the averaging time is set long suited for slow fading. The average received power is then calculated.

A feedback AGC code generator 110 compares the average received power obtained by the average received power calculator 109 with reference power set in the radio communication mobile station to calculate the difference therebetween, obtains the amount of gain control of the AGC amplifier 103 so as to offset the difference, and feeds back the obtained amount as the amount of AGC to the AGC amplifier 103. Thus, the gain of the AGC amplifier 103 is controlled according to the amount of AGC fed back.

According to the present embodiment, in a base station, high fading pitch information is included in a transmission signal to be transmitted to an area where a fading pitch is high. Then, the transmission signal is transmitted. For example, a base station can monitor a change in fading period of a signal transmitted from a radio communication mobile station and transmit fading pitch information to the radio communication mobile station on the basis of a result of the monitoring.

What is claimed is:

1. A radio communication mobile station comprising:
   means for receiving a signal transmitted from a base station;
   variable gain amplifying means for amplifying the received signal;
   demodulating means for demodulating the amplified signal into baseband signals;
   instantaneous received power calculating means for calculating instantaneous received power from the baseband signals;
   fading pitch measuring means for measuring a fading pitch from the instantaneous received power calculated by the instantaneous received power calculating means;
   average received power calculating means for calculating average received power from the instantaneous received power calculated by the instantaneous received power calculating means; and
   automatic gain control (AGC) signal generating means for generating an AGC signal to control the gain of the variable gain amplifying means on the basis of the average received power calculated by the average received power calculating means, wherein
   the average received power calculating means includes means for changing averaging time required to calculate the average received power according to information related to the fading pitch measured by the fading pitch measuring means.

2. A radio communication mobile station comprising:
   an antenna for receiving a signal transmitted from a base station;
   a receiver for converting the received signal having a radio frequency bandwidth into an intermediate frequency signal;
   an automatic gain control (AGC) amplifier for amplifying the intermediate frequency signal;
   an orthogonal demodulator for performing orthogonal demodulation and frequency conversion to the intermediate frequency signal generated from the AGC amplifier to produce I-component and Q-component baseband signals;
   AD converters for converting the I-component and Q-component baseband signals, that are analog, generated from the orthogonal demodulator into digital signals, respectively;

a baseband signal processor for processing the digital signals generated from the AD converters;

an instantaneous received power calculator for calculating instantaneous power from the digital signals generated by the AD converters;

a fading pitch measuring device for measuring a fading pitch from the instantaneous power calculated by the instantaneous received power calculator;

an average received power calculator, which receives the instantaneous power calculated by the instantaneous received power calculator and information related to the fading pitch measured by the fading pitch measuring device, for calculating the average received power from the instantaneous power calculated by the instantaneous received power calculator according to averaging time set depending on the fading pitch; and a feedback AGC code generator for calculating a signal to control the gain of the AGC amplifier so as to offset the difference between reference power and the average received power calculated by the average received power calculator and then feeding back the signal as an AGC signal to the AGC amplifier.

* * * * *